US010840059B2

(12) United States Patent
Shigeoka et al.

(10) Patent No.: US 10,840,059 B2
(45) Date of Patent: Nov. 17, 2020

(54) CHARGED PARTICLE RADIATION DEVICE

(71) Applicant: Hitachi High-Tech Corporation, Tokyo (JP)

(72) Inventors: Kentaro Shigeoka, Tokyo (JP); Takanori Kato, Tokyo (JP); Kazuhiro Morita, Tokyo (JP); Motohiro Takahashi, Tokyo (JP); Masaki Mizuochi, Tokyo (JP); Shuichi Nakagawa, Tokyo (JP); Masao Saida, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/317,386

(22) PCT Filed: Jul. 28, 2016

(86) PCT No.: PCT/JP2016/072102
§ 371 (c)(1),
(2) Date: Jan. 11, 2019

(87) PCT Pub. No.: WO2018/020625
PCT Pub. Date: Feb. 1, 2018

(65) Prior Publication Data
US 2019/0311876 A1    Oct. 10, 2019

(51) Int. Cl.
*H01J 37/16*    (2006.01)
*H01J 37/28*    (2006.01)
(Continued)

(52) U.S. Cl.
CPC .............. *H01J 37/16* (2013.01); *F16F 15/02* (2013.01); *G05D 19/02* (2013.01); *H01J 37/18* (2013.01); *H01J 37/28* (2013.01); *H01J 2237/26* (2013.01)

(58) Field of Classification Search
CPC .......... H01J 37/16; H01J 37/20; F16F 15/002; F16F 15/005; F16F 15/02
See application file for complete search history.

(56) References Cited

U.S. PATENT DOCUMENTS

2011/0127400 A1* 6/2011 Kastelijn ................. F16F 15/02
                                                              248/550
2011/0254944 A1* 10/2011 Ishitani ................... H01J 37/09
                                                              348/80

FOREIGN PATENT DOCUMENTS

JP    6-117481 A    4/1994
JP    8-321274 A    12/1996
(Continued)

OTHER PUBLICATIONS

International Search Report (PCT/ISA/210) issued in PCT Application No. PCT/JP2016/072102 dated Dec. 6, 2016 with English translation (nine (9) pages).
(Continued)

*Primary Examiner* — Eliza W Osenbaugh-Stewart
(74) *Attorney, Agent, or Firm* — Crowell & Moring LLP

(57) ABSTRACT

The purpose of the present invention is to provide a charged particle radiation device capable of performing appropriate vibration suppression control in accordance with a device condition. To achieve the purpose, proposed is a charged particle radiation device provided with: a sample stage for supporting a sample irradiated with a charged particle beam emitted from a charged particle source; and a vacuum chamber for placing the atmosphere in which the sample is disposed in a vacuum state. The charged particle radiation device is provided with: a sensor for detecting vibrations transmitted to the charged particle radiation device; a vibration addition mechanism for vibrating the charged particle radiation device; and a control device for performing feedback control for the vibration addition mechanism in accordance
(Continued)

dance with detection by the sensor, wherein the control device changes a feedback gain of the feedback control in accordance with the type of instruction in a control sequence of the charged particle radiation device.

4 Claims, 12 Drawing Sheets

(51) Int. Cl.
*F16F 15/02* (2006.01)
*G05D 19/02* (2006.01)
*H01J 37/18* (2006.01)

(56) References Cited

FOREIGN PATENT DOCUMENTS

| | | |
|---|---|---|
| JP | 11-16815 A | 1/1999 |
| JP | 2003-255550 A | 9/2003 |
| JP | 2004-246661 A | 9/2004 |
| JP | 2006-153129 A | 6/2006 |
| JP | 2007-247822 A | 9/2007 |
| JP | 2008-115966 A | 5/2008 |
| JP | 2010-242914 A | 10/2010 |
| JP | 2014-93153 A | 5/2014 |
| JP | 2015-133209 A | 7/2015 |

OTHER PUBLICATIONS

Japanese-language Written Opinion (PCT/ISA/237) issued in PCT Application No. PCT/JP2016/072102 dated Dec. 6, 2016 (five (5) pages).

* cited by examiner

[Fig. 5]
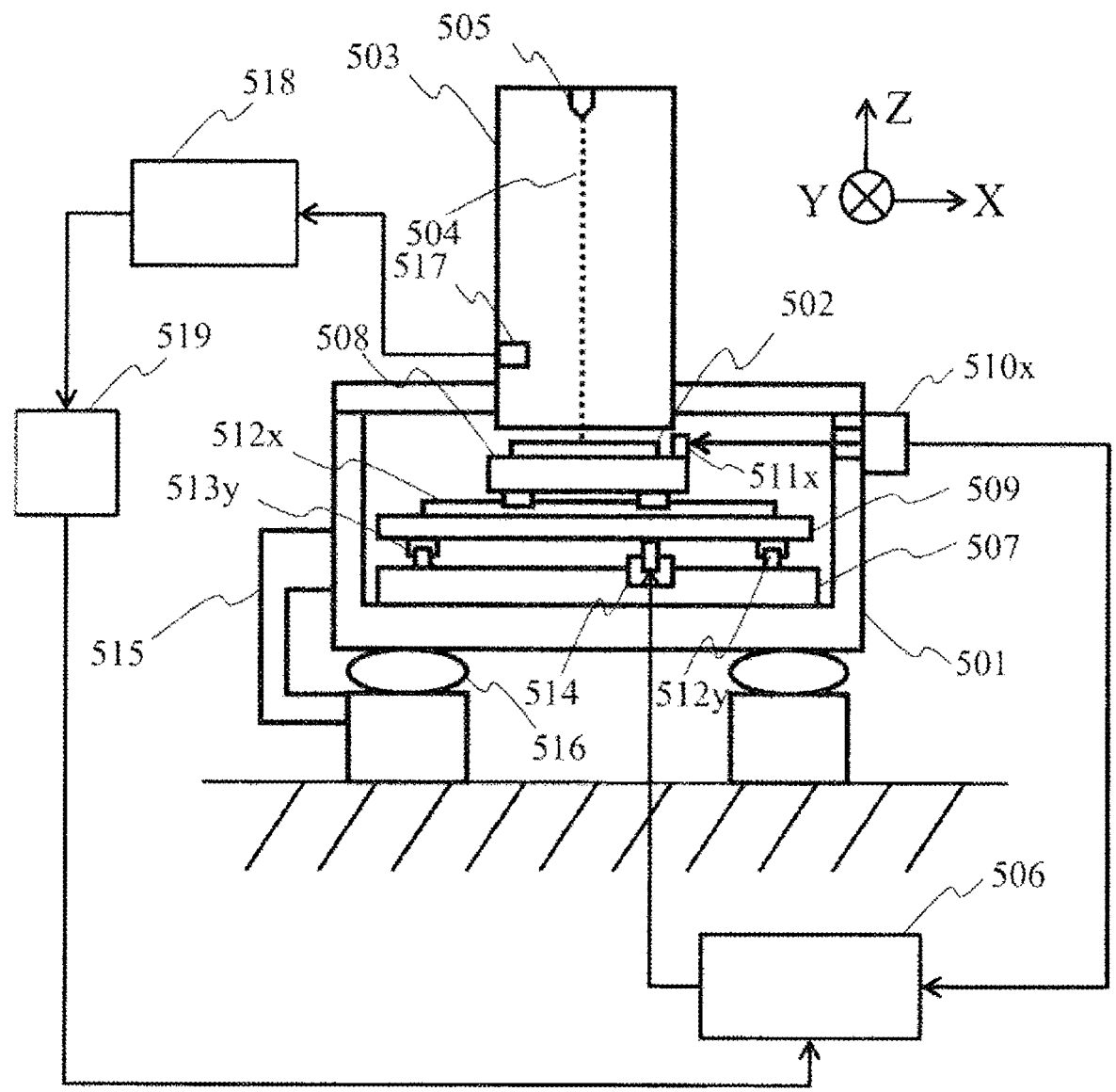

[Fig. 6]
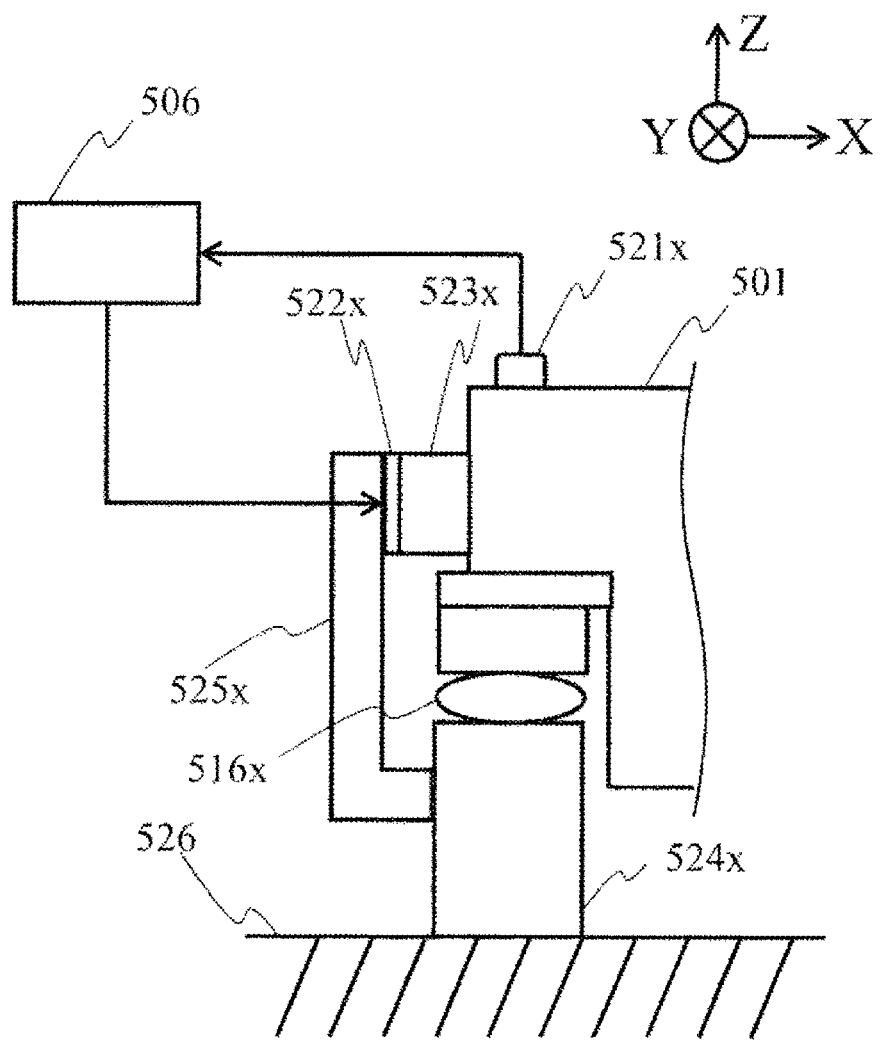

[Fig. 7]
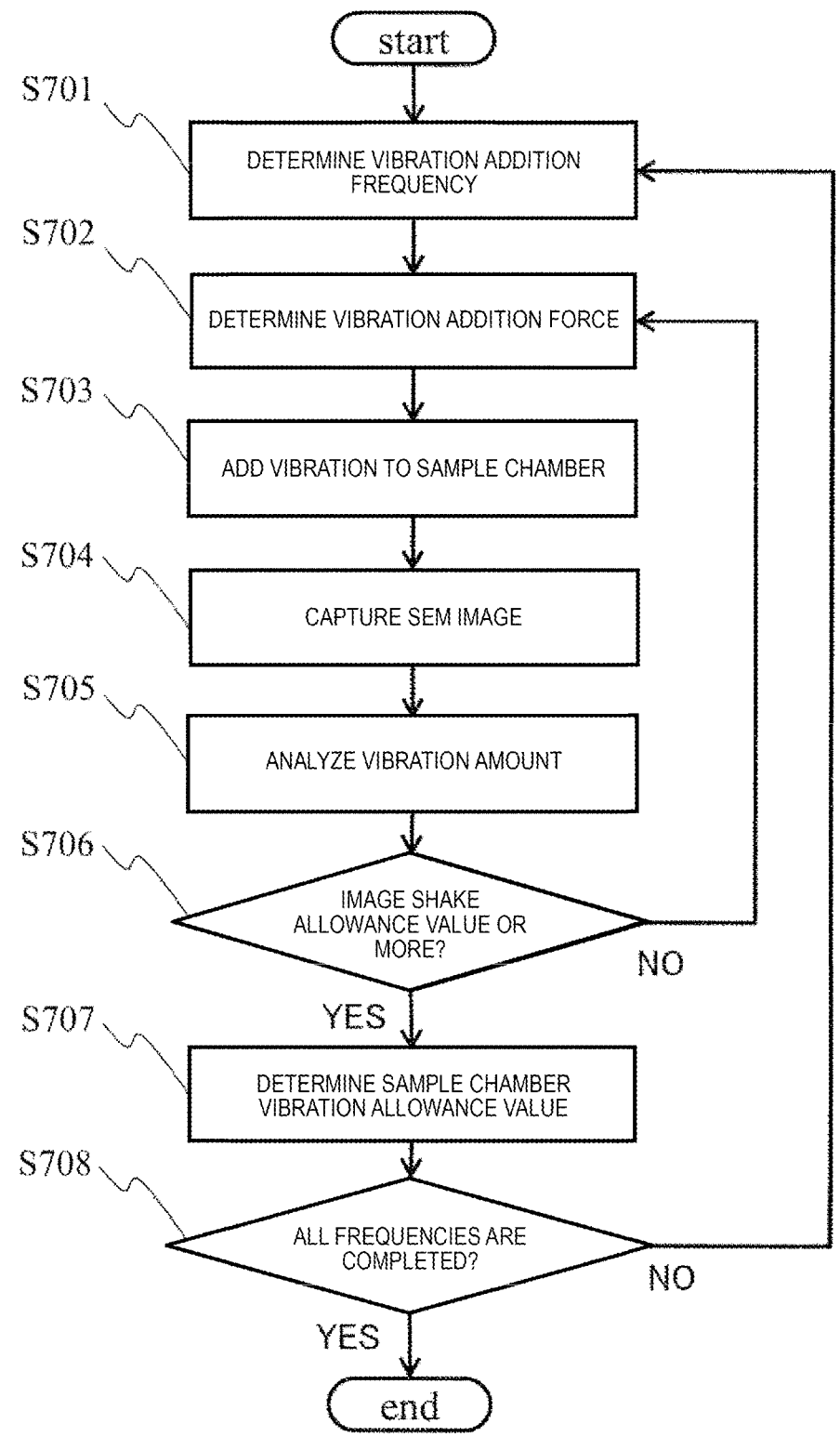

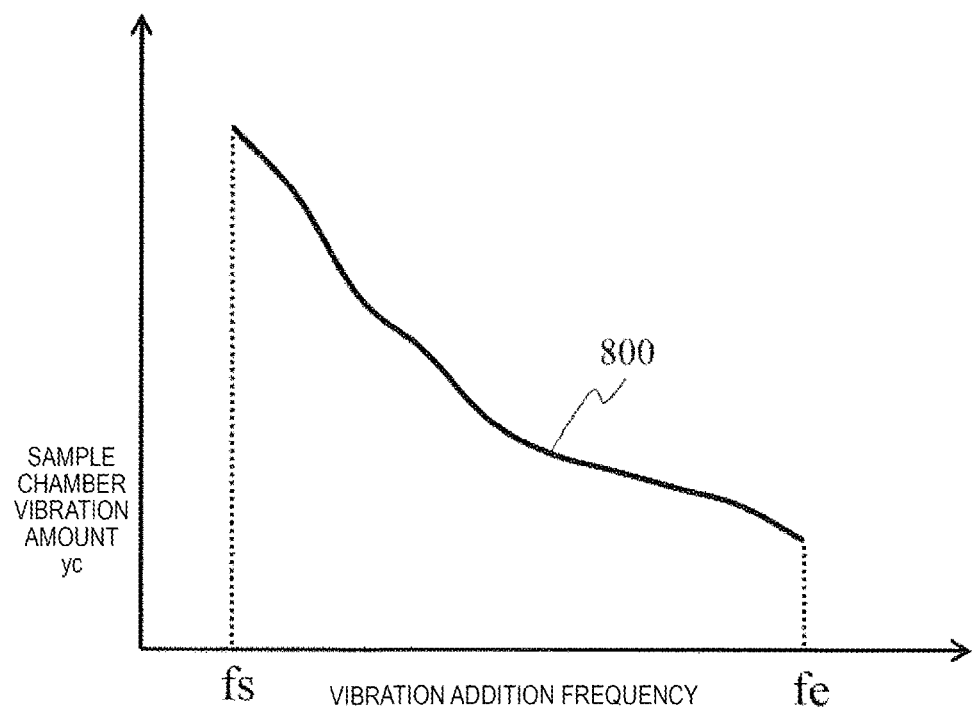
[Fig.8]

[Fig. 9]
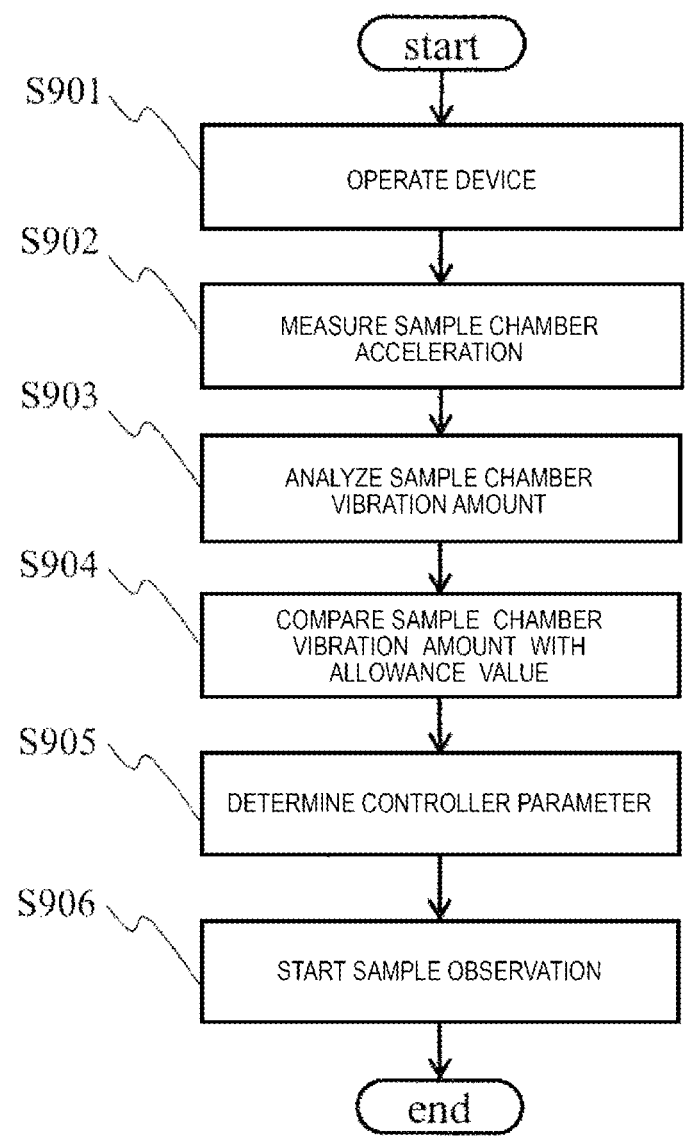

[Fig. 10]
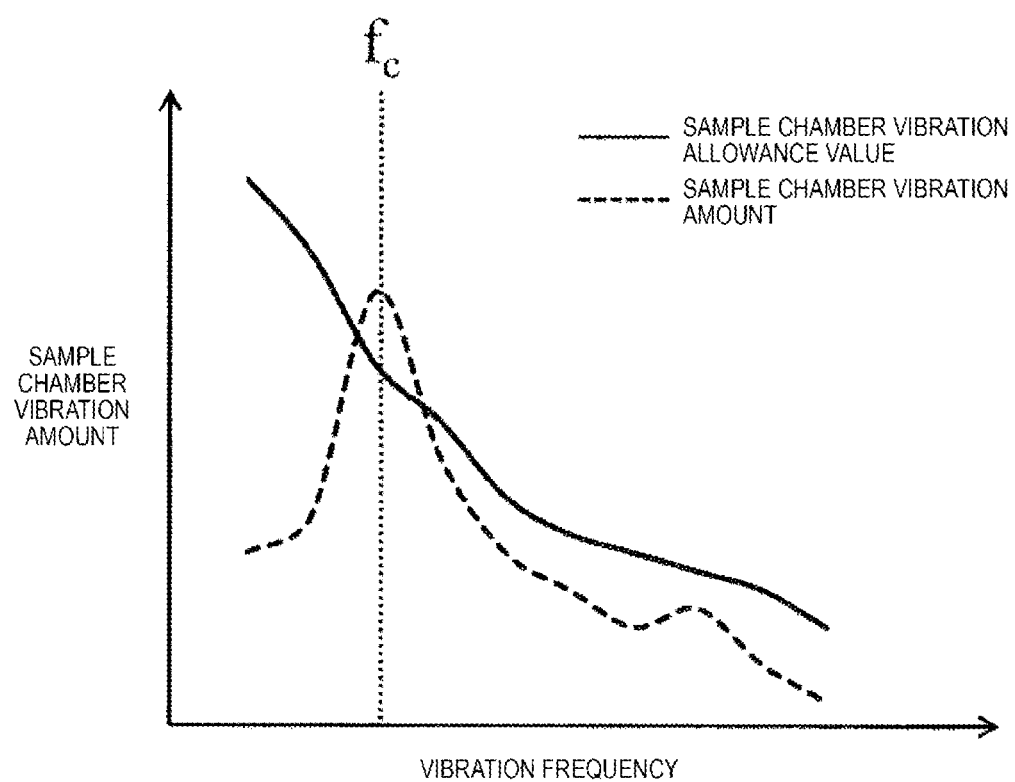

[Fig. 11]
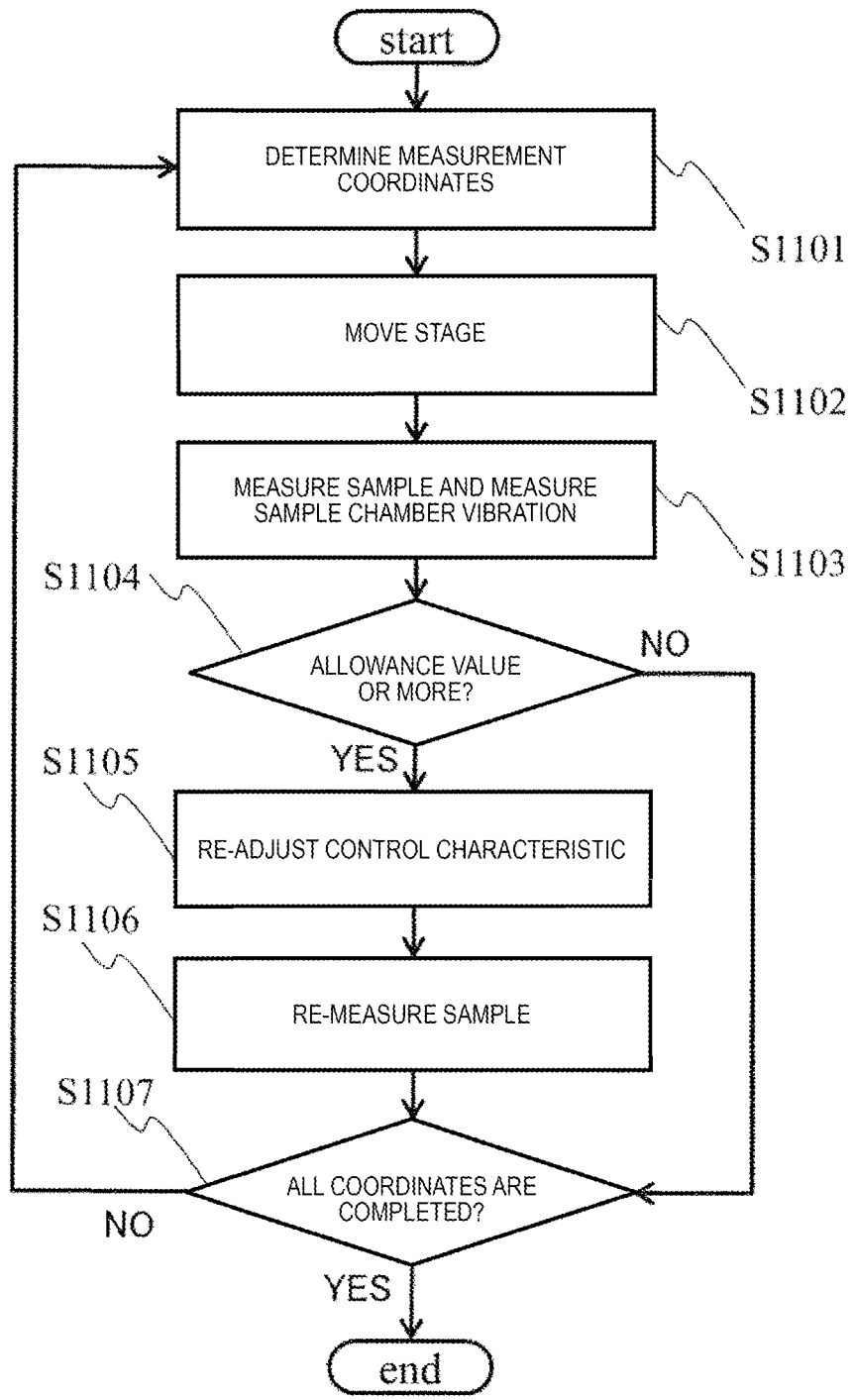

[Fig. 12]
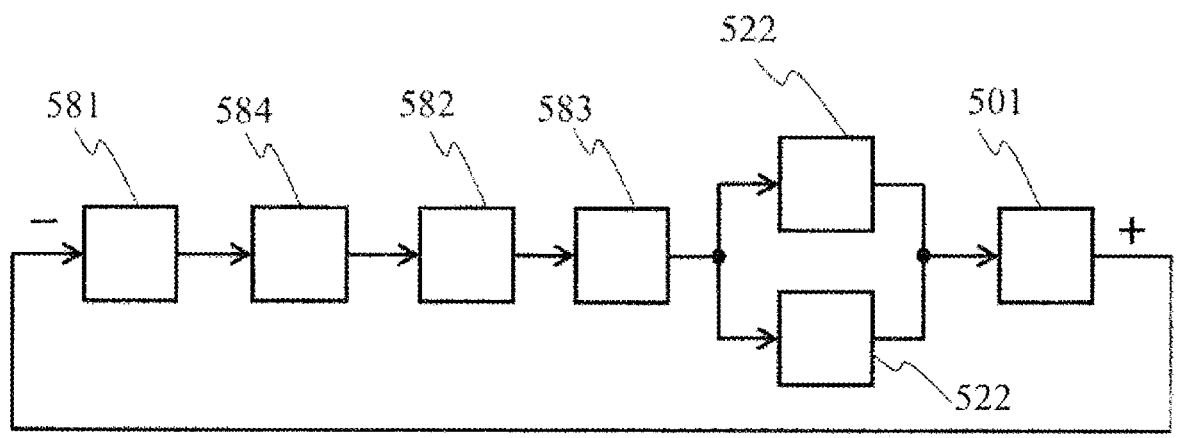

CHARGED PARTICLE RADIATION DEVICE

TECHNICAL FIELD

The present disclosure relates to a charged particle radiation device provided with an active vibration elimination system, and in particular, to a charged particle radiation device that performs a vibration elimination in accordance with a device condition.

BACKGROUND ART

In a charged particle radiation device typified by an electron radiation drawing device, an SEM type wafer inspection device or the like, an active vibration elimination stage is provided for eliminating vibrations from a floor. In addition to having a function as the vibration elimination that prevents the vibrations due to a device installation floor surface from propagating to a device main body, the active vibration elimination stage has a function as a vibration suppression that suppresses the vibrations of the device main body due to a sudden movement of a stage or the like. The vibrations generated from the floor is called a ground motion disturbance, and the vibrations generated from the device main body is called a direct motion disturbance.

There are technologies disclosed in PTL 1 and PTL 2 as technologies for efficiently suppressing vibrations of the direct motion disturbance. PTL 1 discloses a technology of suppressing vibrations of the direct motion disturbance by feedforwarding a control amount with respect to a driving reaction force of a stage to a vibration suppression actuator. In addition, a sliding state control of PTL 2 is a non-linear control that switches a control force in a switching plane, and is characterized by a high robustness against a non-stationary disturbance such as a stage movement. In PTL 3, an acceleration sensor is installed on a mount stage on which a device having a movable unit is mounted and on a device installation floor surface. PTL 3 discloses a driving force method of an actuator in consideration of a floor rigidity by estimating the rigidity of the floor surface on which a device is installed from the detected acceleration signal. In the present technology, vibrations of the sample chamber are eliminated without considering an interface of the device mounted on a vibration elimination stage by adjusting a control characteristic of a PI controller which determines a driving force of an actuator according to a floor rigidity.

CITATION LIST

Patent Literature

PTL 1: JP-A-2008-115966
PTL 2: JP-A-2010-242914
PTL 3: JP-A-2007-247822

SUMMARY OF INVENTION

Technical Problem

Since the feedforward control disclosed in PTL 1 operates only during the stage driving, the feedforward control does not function for residual vibrations after the stage driving is completed. The driving reaction force of the stage driving can be canceled by predicting the driving reaction force of the stage in advance and using the feedforward control. However, since it is difficult to predict the vibrations after stopping the stage, vibrations due to hunting cannot be eliminated.

Also, in the sliding state control disclosed in PTL 2, there is a time delay from an initial state in which a disturbance has generated to the switching of the control mode. Therefore, a transient response tends to get worse, and a time required for the vibration suppression increases. In other words, there is a time delay in switching the control, which may result in insufficient vibration suppression effect.

Particularly, in a high magnification electron microscope and a semiconductor measurement device requiring precise image capturing, in order to improve the throughput of the device and to improve the performance, a stable vibration elimination performance during the image capturing as well as a vibration suppression control with high convergence after stopping the stage as described above are required.

According to the method disclosed in PTL 3, since the floor rigidity is estimated for each environment where the device is installed and the control characteristic is adjusted, a vibration elimination system suitable for the installation environment can be constructed. However, a mechanical characteristic of the sample stage or the electron optical system mounted on the vibration elimination stage when adjusting the control characteristic, and an image shake amount when measuring the sample are not taken into consideration. Therefore, it is difficult to adjust the optimum control characteristic in view of reduction of the image shake amount of the SEM image.

In addition, when the PI control parameter value is excessively increased for reducing the image shake amount, destabilization of the vibration elimination system is caused by the mechanical characteristic of the sample stage and the electron optical system to be mounted. Therefore, in order to have the optimum control characteristic for the vibration elimination mechanism, it is necessary to consider the characteristic of the electron optical system mounted on the vibration elimination stage and the image shake amount.

In the following, a charged particle radiation device for the purpose of appropriate vibration suppression control in accordance with a device condition will be proposed.

Solution to Problem

As one aspect for achieving the above object, there is provided a charged particle radiation device including: a sample stage for supporting a sample irradiated with a charged particle beam emitted from a charged particle source; a vacuum chamber for placing an atmosphere in which the sample is disposed in a vacuum state; a sensor for detecting vibrations transmitted to the charged particle radiation device; a vibration addition mechanism for vibrating the charged particle radiation device; and a control device for performing feedback control for the vibration addition mechanism in accordance with a detection by the sensor, in which the control device changes a feedback gain of the feedback control in accordance with a type of instruction in a control sequence of the charged particle radiation device.

As another aspect for achieving the above object, there is provided a charged particle radiation device including: a sample chamber; a charged particle optical system mounted in the sample chamber; an image processing device for processing a signal detected by the charged particle optical system; a sensor for measuring a vibration amount of the sample chamber; a driving mechanism for finely vibrating the sample chamber; and a control device for controlling the driving mechanism, in which the control device adjusts a control characteristic of the driving mechanism using image information obtained from the charged particle optical system and vibration information of the sample chamber.

Advantageous Effects of Invention

According to the above configuration, it is possible to perform appropriate vibration suppression control in accordance with a device condition.

BRIEF DESCRIPTION OF DRAWINGS

FIG. 5 is a diagram explaining a configuration of the charged particle radiation device.

FIG. 6 is a schematic diagram of a vibration elimination mechanism.

FIG. 7 is a flowchart for calculating an allowance value of sample chamber vibration with respect to an image shake amount.

FIG. 8 is a diagram showing a relationship between vibration frequencies and sample chamber vibration allowance values.

FIG. 9 is a flowchart showing initial adjustment steps of a control characteristic of a vibration elimination system.

FIG. 10 is a diagram showing a relationship between sample chamber vibration amounts and allowance values.

FIG. 11 is a flowchart showing a vibration elimination system adjustment steps at sample observation.

FIG. 12 is a block diagram of a servo control system.

DESCRIPTION OF EMBODIMENTS

Figure 1:
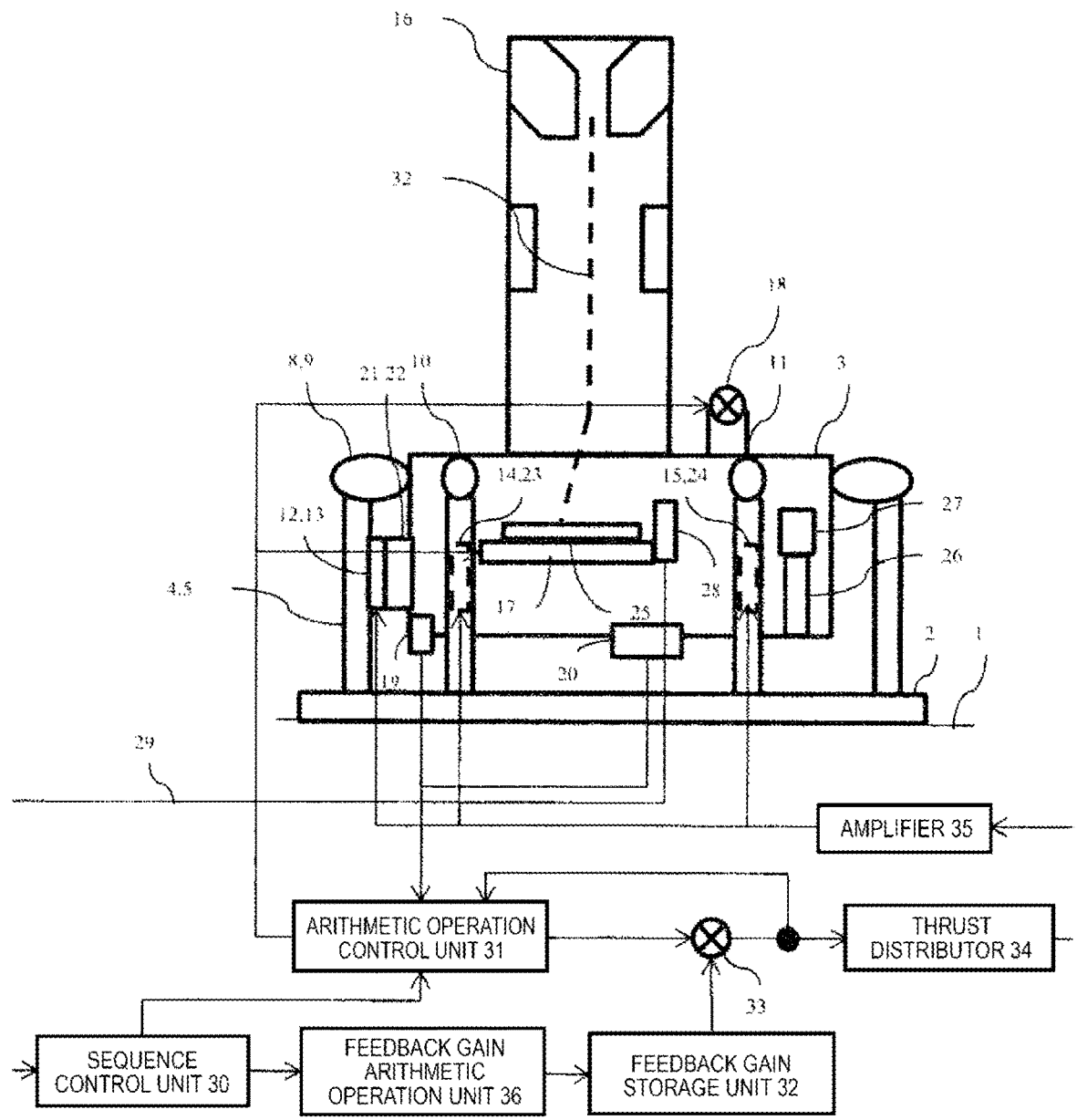
FIG. 1 is a diagram showing an example of a charged particle radiation device having an active vibration elimination function and an automatic parameter adjustment function of the active vibration elimination function.

In recent years, fine patterns formed in semiconductor devices have progressed, and a line width of the pattern is also becoming extremely fine as several nm. In a device that performs measurement or inspection of a semiconductor by irradiating a semiconductor wafer or the like with a charged particle radiation, it is necessary to make the charged particle radiation reach a circuit pattern with high accuracy. For that purpose, it is necessary to minimize vibrations quickly after stopping a stage.

However, due to a driving mechanism that realizes high-speed movement of the stage for the purpose of improving the throughput, the residual vibrations after the stage stop increases. Further, in the charged particle radiation device, a vacuum valve is opened and closed at the time of loading/unloading the wafer, thereby generating direct disturbance. The charged particle radiation device used for measurement or inspection of the semiconductor may be installed under various environments, and ground disturbance is not constant. In addition, the nature of the ground disturbance applied to the charged particle radiation device by a location of a semiconductor factory and ground cannot be uniquely determined.

In the embodiment described below, for the purpose of highly accurate vibration suppression of residual vibrations after the stage stop and vibrations caused by other vibration generation factors, a charged particle radiation device is proposed which switches a control method of the vibration elimination in accordance with the nature of disturbance. The configuration of the device for realizing such vibration suppression will be described below.

(1) A device (for example, a charged particle radiation device such as a scanning electron microscope) is provided with a stage for placing a sample and a vacuum chamber for placing the stage in a vacuum atmosphere. In the vacuum chamber, a valve for maintaining a vacuum state in the vacuum chamber is disposed, and an acceleration sensor for detecting vibrations of the vacuum chamber and an actuator (vibration addition mechanism) for applying force to the vacuum chamber are provided. In addition, a preliminary exhaust chamber (load lock chamber) is provided for carrying in or out the sample into the vacuum chamber while maintaining the vacuum state in the vacuum chamber (sample chamber) The preliminary exhaust chamber is provided to change the atmosphere around the sample carried in from the outside from the atmosphere to vacuum or from vacuum to atmosphere, and the valve provided between the preliminary exhaust chamber and the atmosphere space is opened and closed depending on the carrying in or out of the sample.

The device also includes an arithmetic operation control unit that calculates a driving amount of the actuator in order to eliminate vibrations of the vacuum chamber based on a detection signal by the acceleration sensor. Further, the device has a sequence control unit for processing a recipe describing instructions, settings and parameters for the device, and can request the arithmetic operation control unit to switch control.

Based on the detection signal from the acceleration sensor, the arithmetic operation control unit operates the vibration of the vacuum chamber, drives the actuator according to the driving method requested from the sequence control unit, and performs a feedback control.

(2) Preferably, in the above (1), the arithmetic operation control unit includes means for deriving an optimal feedback gain at the time of driving the valve and moving the stage.

(3) Preferably, in the above (2), the arithmetic operation control unit has means for calculating a solution of a regulator in accordance with an optimum control rule in order to derive the feedback gain.

(4) Preferably, in the above (3), the arithmetic operation control unit operates a coefficient matrix in an evaluation function of the regulator, and a vibration suppression characteristic can be varied by a value set in the coefficient matrix.

(5) Preferably, in the above (4), the arithmetic operation control unit includes means for storing the coefficient matrix.

(6) Preferably, in the above (5), the arithmetic operation control unit has means for on-line searching for an optimal coefficient matrix for a state of disturbance.

(7) In a semiconductor manufacturing device, a semiconductor is manufactured using the charged particle radiation devices (1) to (6).

(8) In a semiconductor inspection device, a semiconductor is manufactured using the charged particle radiation devices (1) to (6).

According to the above configuration, it is possible to realize a charged particle radiation device that maximizes the stability and performance of the vibration elimination function according to device differences and customer environments by automatically switching control parameters for vibration elimination in accordance with the type of disturbance. Furthermore, by automatic calculation of the optimum control gain taking into consideration the dynamic characteristics of the device and disturbance, even a service engineer who does not have knowledge of the feedback control can adjust to active vibration elimination that realizes high vibration suppression/vibration elimination performance while maintaining stability.

Embodiment 1

Hereinafter, an outline of a charged particle radiation device having a vibration suppression mechanism will be described with reference to the drawings. Note that, in the following description, as one aspect of the charged particle radiation device, a scanning electron microscope that scans an electron beam onto a sample will be described as an example, however, the present invention is not limited thereto, and a vibration suppression mechanism as exemplified below may be provided in an ion beam device that irradiates an ion beam, for example. FIG. 1 is a diagram showing an example of a scanning electron microscope having a vibration suppression mechanism.

In FIG. 1, supporting poles 4, 5, 6 and 7 for fixing the vacuum chamber 3 at four corners are provided on a base stage 2 placed on a floor 1. The supporting poles 4, 5, 6, 7 and the vacuum chamber 3 are joined by vibration elimination mounts 8, 9, 10 and 11. In addition, on the base stage 2, two movers 21, 22, 23 and 24 for transmitting a reaction force to the vacuum chamber 3 are provided on each of the X axis and the Y axis.

In the vacuum chamber 3, an electron beam source 16, an XY stage 17, and a vacuum valve 18 are disposed, acceleration sensors 19 and 20 are respectively provided on the X axis and the Y axis, and stators 12, 13, 14 and 15 for receiving the reaction force from the base stage are provided one for each of the movers 21, 22, 23 and 24.

A sample 25 to be irradiated with an electron beam is fixed on the XY stage 17, and the XY stage 17 moves the sample 25 so as to change an irradiation position of the electron beam. At this time, a laser light emitted from a laser length measurement meter 27 supported by the supporting pole 26 in the vacuum chamber is reflected by a mirror 28 fixed on the XY stage 17. The laser length measurement meter 27 accurately measures a position of the XY stage 17 from an interference between the emitted light and the reflected light of the mirror 28, and transfers a position signal 29 to a sequence control unit 30.

The sequence control unit 30 is used to process the control sequence of the device and can transfer control instructions to the electron beam source 16, the XY stage 17, and the vacuum valve 18. In addition, an arithmetic operation control unit 31 sets the acceleration sensors 19 and 20 as an input to eliminate floor vibrations and provides a vibration suppression force to the movers 21, 22, 23 and 24.

In the control sequence of the device (operation recipe (operation program for automatically controlling the scanning electron microscope)), when the XY stage 17 is precisely positioned to a target position, the charged particle radiation 32 is emitted from the electron beam source 16 and irradiated on the sample 25. As semiconductor integrated circuits are miniaturized every year, there is an increasing demand for improvement in positioning accuracy of the XY stage 17, reduction in positioning time, and improvement in irradiation accuracy of charged particles on the sample 25.

In order to drive the XY stage at a high speed, it is necessary to improve a performance of the driving mechanism, however, as the performance of the XY stage 17 improves, the driving reaction force of the XY stage 17 increases and the direct motion disturbance increases. In the present embodiment, a scanning electron microscope will be described which suppresses ground disturbance transmitted to the vacuum chamber 3 from the floor 1 via the base stage 2 and suppresses direct motion disturbance to the chamber 3 due to the movement of the XY stage 17 and opening and closing of the vacuum valve 18 with high accuracy.

In addition to the charged particle radiation device used for the semiconductor inspection and measurement, charged particle radiation device to suppress such floor vibrations and direct motion disturbance includes an electron radiation drawing device, an electron microscope, a holography device, or the like.

Figure 2:
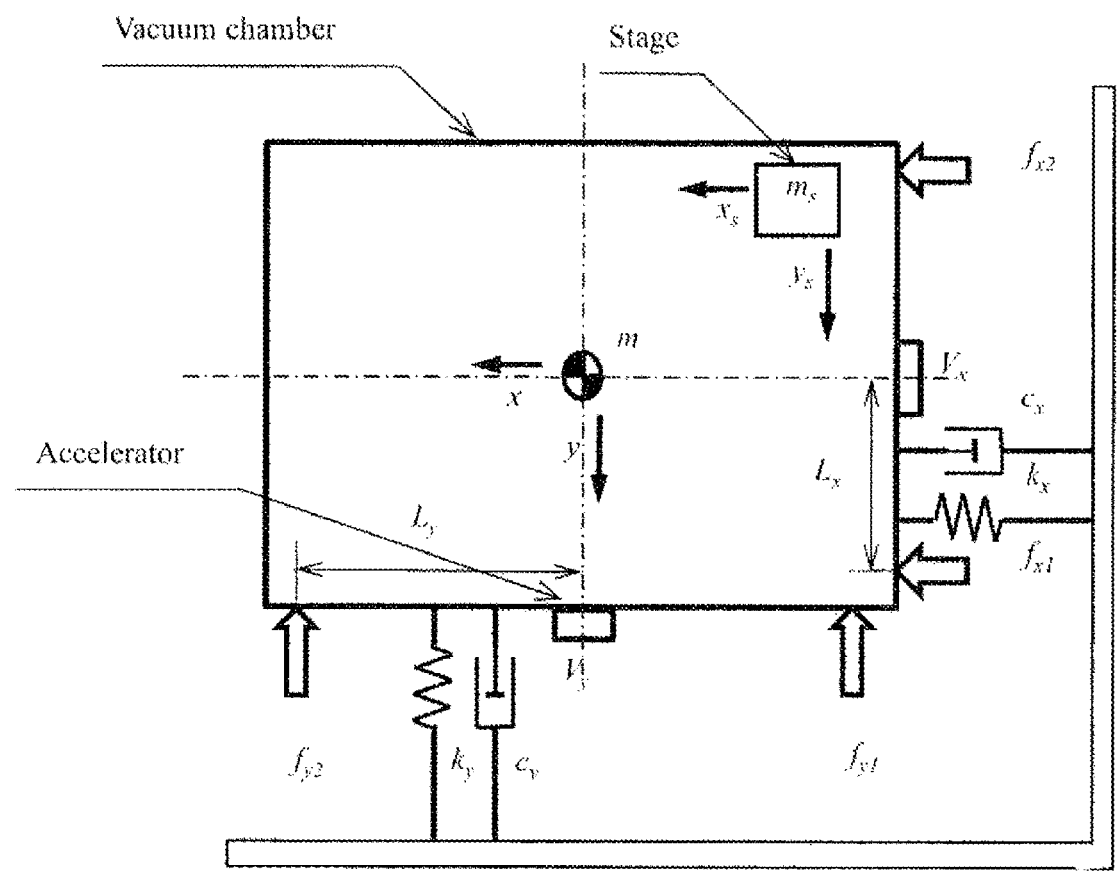
FIG. 2 is a diagram showing a physical model of a vacuum chamber to be subjected to eliminate vibrations.

Note that, in order to precisely suppress vibrations generated in three dimensions, it is desirable to perform vibration suppression of six axes in an X axis direction and a Y axis direction (horizontal direction), a Z axis direction (vertical direction), a θX axis direction which is a rotation direction, a θY axis direction, and a θZ axis direction using the configuration illustrated in FIG. 2. In order to perform the vibration suppression in six directions by combining a linear direction vibration (a first vibration) and a rotation direction vibration (a second vibration), dispose three or more linear actuators in the horizontal direction and three or more in the vertical direction.

For the sake of simplicity of explanation in the embodiment, an example in which a vibration of the chamber due to the reaction force of the stage movement is generated in the X direction and the Y direction, which is the main movement direction for lowering the positioning accuracy of the charged particle radiation, and the vibration thereof is suppressed will be described. It is possible to control without considering the vibration suppression of the θZ axis by adjusting inputs to the two actuators so as not to rotate in the θZ axis direction using the thrust distributor 23. Further, in a case of considering a rotation component θZ in the horizontal plane direction, an acceleration value of the rotation component is obtained using a main inertia axis separator. However, not only the configuration shown in this embodiment but also extension and implementation to a control method with six degrees of freedom is possible.

The weight of the base stage 2 is increased in order to prevent vibration transmission from the floor 1. Also, in the base stage, the vibration elimination mounts 8, 9, 10 and 11 for fixing the vacuum chamber 3 can obtain a large supporting force with a simple structure. The linear actuator is configured with supporting poles 4, 5, 6, 7, stators 12, 13, 14, 15, and movers 21, 22, 23, 24. By energizing the stators 12, 13, 14 and 15, the movers 21, 22, 23 and 24 are driven by utilizing an electromagnetic force to eliminate vibrations of the vacuum chamber 3. As the acceleration sensor, an acceleration sensor in the horizontal X axis direction 19 and an acceleration sensor in the horizontal Y axis direction 20 are provided.

Next, the sequence control unit 30 drives the XY stage 17 and moves the sample 25 to a target coordinate position. Further, the sample 25 is irradiated with the charged particle radiation 32 from the electron beam source 16, and the desired inspection is performed. In parallel with the above control, the sequence control unit 30 opens and closes the vacuum valve 18 in accordance with unloading/loading of a wafer. At this time, the sequence control unit 30 notifies the arithmetic operation control unit 31 of the control instruction corresponding to the sequence to be executed before the sequence such as stage driving and opening and closing of the vacuum valve described above is executed. As a result, the arithmetic operation control unit 31 can apply the vibration suppression control in advance for the vibrations caused by driving the machine.

Next, a vibration elimination control unit using a linear actuator will be described. The vibration elimination control unit configured with an arithmetic operation control unit 31 and a feedback gain storage unit 32, a multiplier 33, a thrust distributor 34, and an amplifier 35. The arithmetic operation control unit 31 has a function as a state observer and switches a driving method in accordance with the control instruction notified from the sequence control unit 30. The arithmetic operation control unit 31 receives the acceleration information obtained from the acceleration sensors 19 and 20 and the position signal 29 obtained from the laser length measurement meter 27 and outputs a control amount matrix. The obtained control amount matrix and the feedback matrix storage unit 32 are multiplied by the multiplier 33 and the reaction force to the vacuum chamber 3 is distributed to the stators 12, 13, 14 and 15 so that the vacuum chamber 3 does not rotate in the θZ direction by the thrust distributor 34.

From the above structural model, a state feedback system that suppresses the vibrations of the vacuum chamber 3 is constructed using a linear actuator. The linear actuator is used for the vibration suppression of the reaction force due to the movement of the XY stage 17 which is a direct motion disturbance, and is also used as an actuator aiming at vibration elimination of a ground disturbance.

In a case where the vacuum chamber 3 and an equipment mounted in the vacuum chamber 3 are defined as one rigid body, motion equations of the vibration elimination stage of the XY two axes are as follows.

$$mx''(t)+c_x x'(t)+k_x x(t)=f_{x1}(x_s)+f_{x2}(x_s)+m_s x''_s(t) \quad \text{[Equation 1]}$$

$$my''(t)+c_y y'(t)+k_y y(t)=f_{y1}(y_s)+f_{y2}(y_s)+m_s y''_s(t) \quad \text{[Equation 2]}$$

Here, in the above [Expression 1], t is time, m is total mass of the vacuum chamber 3, $m_s$ indicates the total mass of the XY stage 17. x" (t) is an X axis acceleration of the chamber, x"$_s$ (t) is an X axis acceleration of the stage, x' (t) is an X axis speed of the vacuum chamber 3, x' (t) is an X axis speed of the XY stage 17, $c_x$ is an attenuation factor due to the vibration elimination mount in the X axis direction, $k_x$ indicates a spring coefficient supporting the vacuum chamber by the vibration elimination mount in the X axis direction. Also, $f_{x1}$ and $f_{x2}$ are driving forces in the X axis direction generated by the linear actuator. An action point of $f_{x1}$ is apart from a center of the vacuum chamber 3 by a distance $-L_x$, and $f_{x2}$ is apart from the center of the vacuum chamber 3 by $+L_x$.

Similarly, in the above [Equation 2], y"(t) is a Y axis acceleration of the vacuum chamber 3, y"$_s$(t) is a Y axis acceleration of the XY stage 17, y' (t) is a Y axis speed of the vacuum chamber 3, y' (t) is a Y axis speed of the XY stage 17, $c_y$ is an attenuation factor due to the vibration elimination mount in the Y axis direction, $k_y$ indicates a spring coefficient supporting the vacuum chamber 3 by the vibration elimination mount in the Y axis direction. Also, $f_{y1}$ and $f_{y2}$ are driving forces in the X axis direction generated by the linear actuator. An action point of $f_{y1}$ is apart from the center of the vacuum chamber 3 by a distance $-L_y$, and $f_{y2}$ is apart from the center of the vacuum chamber 3 by $+L_y$.

Values of the action force $f_{x1}$ and $f_{x2}$ are calculated using the driving force $f_x$ in the X axis direction and X coordinate $x_s$ of the stage by the thrust distributor 23 as shown in the following [Equation 3]. This calculation formula can be implemented not only by the formula shown in this embodiment but also by another calculation method which is different depending on the mechanism of the vacuum chamber 3 and the driving force of the XY stage 17.

$$f_{x1}(x_s) = x_s f_x, \quad f_{x2}(y_x) = \frac{2Lx - x_s}{2Lx} f_x \quad \text{[Equation 3]}$$

Similarly, the action force in the Y axis direction is represented by the following [Equation 4].

$$f_{y1}(y_s) = \frac{y_s}{2Ly} f_y, \quad f_{y2}(y_s) = \frac{2Ly - y_s}{2Ly} f_y \quad \text{[Equation 4]}$$

The state equations of the following [Equation 5] and [Equation 6] can be created by the motion equations of [Equation 1] and [Equation 2] considering simultaneous X and Y axes. In the present embodiment, it will be explained based on a continuous system state equation, although it can also be implemented if it is represented by a discrete system state equation.

$$\begin{aligned} X' &= AX(t) + B_1 U_1 + B_s U_s \\ Y &= CX(t) \end{aligned} \quad \text{[Equation 5]}$$

$$A = \begin{bmatrix} 0 & 0 & 1 & 0 \\ 0 & 0 & 0 & 1 \\ -\frac{k}{m} & -\frac{c}{m} & 0 & 0 \\ 0 & 0 & -\frac{c}{m} & -\frac{k}{m} \end{bmatrix} \quad \text{[Equation 6]}$$

$$B_1 = \begin{bmatrix} b11 & b12 \\ b21 & b22 \\ b31 & b32 \\ b41 & b42 \end{bmatrix}$$

$$B_s = \begin{bmatrix} bs11 & bs12 \\ bs21 & bs22 \\ bs31 & bs32 \\ bs41 & bs42 \end{bmatrix}$$

$$U_1 = \begin{bmatrix} u_x \\ u_y \end{bmatrix}$$

$$U_s = \begin{bmatrix} u_{sx} \\ u_{sy} \end{bmatrix}$$

$$Y = \begin{bmatrix} x \\ y \\ x' \\ y' \end{bmatrix}$$

$$C = \begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

According to [Equation 6], the charged particle radiation device described in the embodiment is a system with four inputs and four outputs. Since the rank of a controllable matrix of the embodiment is four, it is controllable. In above

Figure 4:
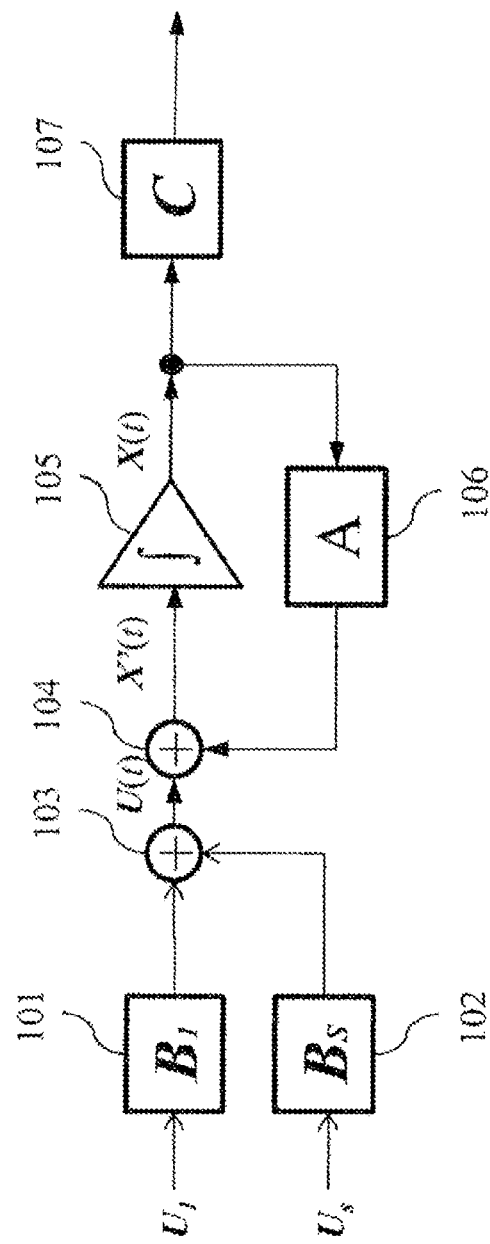
FIG. 4 is a control block diagram of the active vibration elimination mechanism.

[Equation 5], A is a system transition matrix, X is a state variable matrix, X' is a first order differential matrix of X, $B_1$ is an input matrix by the XY axis linear actuator, $B_s$ is an input matrix by the driving reaction force of the stage. Also, Y is an output variable matrix, and C is an output control matrix. FIG. 4 is a schematic diagram of the above [Equation 6].

In FIG. 4, an output $B_1$ of the input matrix arithmetic operator 101 by the linear actuator and an output $B_s$ of the input matrix arithmetic operator 102 by the driving reaction force of the stage are added by an addition point 103 to become an input U for moving the vacuum chamber.

The state variable matrix X is obtained by inputting the first order differential matrix X' to an integrator 105. In addition, the state variable matrix X is configured to be fed back to an addition point 104 via a system transition matrix 106. The output variable Y is obtained by inputting the state variable matrix X to an output control matrix arithmetic operator 107.

In the two axes XY, the state variable matrix X is configured with an X axis displacement x, a Y axis displacement y, an X axis speed x', and a Y axis speed y'. Also, $U_1$ is configured with input components in directions of the X axis and the Y axis of the vacuum chamber. On the other hand, $U_s$ is configured with the X axis acceleration and the Y axis acceleration of the stage. At this time, although the acceleration value of the XY stage 17 can be measured, since it is necessary to position the charged particle radiation 32 at the target coordinates of the sample 25, the input variable $U_s$ cannot be changed for the vibration suppression. Since an input that can be used for the vibration suppression against direct motion disturbance is only the linear actuator, only an input variable matrix $U_1$ becomes controllable, and it can be represented by the following [Equation 7].

$$X'=AX(t)+B_1 U_1$$

$$Y=CX(t) \quad \text{[Equation 7]}$$

A control side for determining a control input by the linear actuator is shown in the following formula [Equation 8].

$$U_1(t)=-KX(t) \quad \text{[Equation 8]}$$

In the above formula [Equation 8], K is a feedback gain matrix for feeding back the state variable matrix X. As a result, the linear actuator operates as a regulator that operates so that elements of the state variable matrix X and the control input $U_1$ are all zero.

Since the control by the state equation shown in the above formula is two inputs and four outputs, generally, the feedback gain matrix K cannot be uniquely determined. Therefore, a generally known feedback gain matrix determination method by the optimum control side is used. (For example, literature "Mechatronics and control engineering, written by Yohji Okada and published by Yokendo")

Further, a feedback gain matrix that minimizes an evaluation function shown in the following formula [Equation 9] can be obtained by solving a Riccati's equation shown in the following formula [Equation 10].

$$J = \int_0^\infty [X^T Q X + U_1^T R U_1] dt \quad \text{[Equation 9]}$$

$$PA + A^T P - PBR^{-1}B^T P + Q^T = 0 \quad \text{[Equation 10]}$$

$$K = R^{-1}B^T P = \begin{bmatrix} k11 & k12 & k13 & k14 \\ k21 & k22 & k23 & k24 \end{bmatrix}$$

In [Equation 9], Q is a weight matrix for the weighted squared integral error, R is a weight matrix for the squared integral value of the operation signal, P is a positive unique solution satisfying the Riccati's equation, and K is a feedback gain matrix. By a simulation, weight matrices Q, R and the feedback gain are determined as follows.

$$Q = \text{diag}(1.0 \times 10^6, 2.5 \times 10^6, 2.5 \times 10^6, 1.0 \times 10^6) \quad \text{[Equation 11]}$$

$$R = \text{diag}(1.0, 1.0) \quad \text{[Equation 12]}$$

The solution of Riccati's equation can be easily obtained on a calculator using Kleinmann-Newton method or the like. Using the obtained feedback gain matrix K, a calculator simulation according to the above formula [Formula 9] taking into consideration the driving of the XY stage 17 is implemented, and a feedback gain matrix K that returns an appropriate response to the direct motion disturbance and the ground motion disturbance is determined. In the calculator simulation, together with the response of the vibration elimination control, it is necessary to obtain the feedback gain K in consideration of windup of the control input $U_1$. The obtained feedback gain matrix K is stored in the feedback gain matrix storage unit 35.

In the present embodiment, speed information is obtained by integrating acceleration sensor information, it can also be used for calculation by using the state observer and estimating a state variable that cannot be observed directly from the control amount to be output and the measured observation amount.

An output variable Y obtained from the state observer and a matrix stored in the feedback gain storage unit 36 is multiplied by the multiplier 33. Control matrix signals obtained by the result is input to the thrust distributor, and the output is distributed to each linear actuator. The output signals of each linear actuator distributed by the thrust distributor are output to the amplifier 31 respectively, and vibrations are added to the stators 12, 13, 14 and 15.

According to the above embodiment, in addition to sensor information provided in the observable vacuum chamber, highly accurate vibration suppression performance against direct motion disturbance can be realized using the control amount of the linear actuator and the position information of the XY stage 17.

However, in the above-described embodiment, considering errors such as changes in ground motion disturbance in device differences and customer environments, sufficient performance cannot be obtained only with a nominal model. Furthermore, the feedback gain using the feedback gain matrix determination method by the optimum control side has high stability, however, the convergence is conservative.

Therefore, parameters that can be adjusted on-line are provided in the matrix stored in the feedback gain storage unit. By providing parameters that can be adjusted for the weight Q of the regulator and changing the adjustment parameters according to the installation environment, the stability of the state control is guaranteed, and at the same time, the vibration suppression control capable of obtaining the optimum effect is realized. The control parameters introduce $p_x$ and $p_y$ on each of the x axis and y axis which are susceptible to the installation environment. The weight $Q_p$ including the adjustment parameter is determined as shown in the following [Equation 13].

$$Q_p = \text{diag}(p_x \times 1.0 \times 10^6, p_y \times 2.5 \times 10^6, p_x \times 2.5 \times 10^6, p_y \times 1.0 \times 10^6) \quad \text{[Equation 13]}$$

Figure 3:
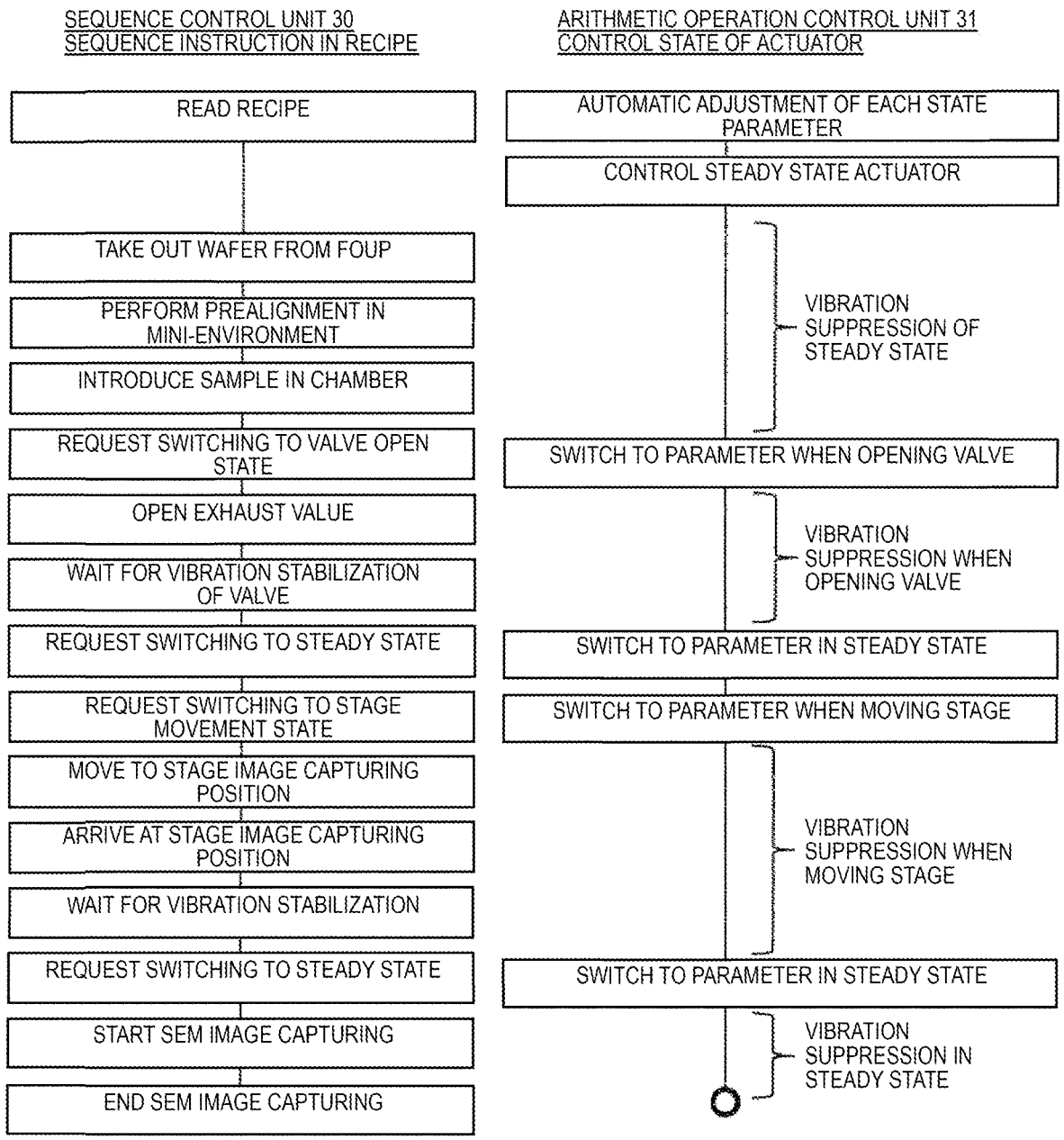
FIG. 3 is a flowchart showing steps of switching control parameters of an active vibration elimination mechanism according to steps of an operation program of the charged particle radiation device.

As a result, $p_x$ and $p_y$ can be switched in advance to the optimum control parameters for each disturbance caused by a machine drive such as opening and closing of the vacuum valve 18 and movement of the XY stage 17. In order to switch the control parameters before driving the machine, the sequence control unit 30 notifies the feedback gain arithmetic operation unit 36 of switching of the control. For example, as shown in FIG. 3, the sequence control unit 30 notifies the feedback gain arithmetic operation unit 36 of switching to the valve exhaust control before executing the sequence instruction of the vacuum valve opening.

A control process by an operation program of a scanning electron microscope called a recipe will be described. In the scanning electron microscope for measuring and inspecting semiconductor wafers or the like, recipes for performing the automatic inspection and the automatic measurement are prepared. As illustrated in FIG. 3, the scanning electron microscope prepares for the automatic measurement and inspection by reading the recipe prepared according to the type of sample and the purpose such as measurement. A scanning electron microscope for measuring and inspecting a semiconductor wafer includes a vacuum chamber that contains a stage for supporting a sample to be irradiated with an electron beam, an electron microscope column that scans the focused electron beam on the sample and detects a signal obtained by the scanning, an aligner for performing pre-alignment before introducing a sample into a preliminary exhaust chamber for vacuum exhausting a sample atmosphere introduced into the sample chamber and the preliminary exhaust chamber, and an air purification space maintenance mechanism called a mini-environment in which a robot for taking out a wafer from a wafer cassette such as FOUP is built.

When the FOUP is mounted on the scanning electron microscope from which the recipe has been read, the FOUP opener opens the wafer take-out port of the FOUP and the wafer is taken out by the robot. As illustrated in FIG. 3, at this time, in order to perform an actuator control in a steady state (a state in which large vibrations do not occur), the feedback gain arithmetic operation unit 36 calculates a feedback gain from the evaluation function of the optimum regulator using the control parameters px and py registered in advance for the steady state and stores the calculated feedback gain in the feedback gain storage unit 32. In the steady state, the vibration suppression control using the feedback gain for the steady state is performed. Next, the robot conveys the wafer to the prealignment aligner, and the aligner obtains the positional displacement of the wafer by obtaining an eccentricity amount when the wafer is rotated. The robot adjusts the conveyance position to the preliminary exhaust chamber so as to suppress the displacement.

Next, the valve is opened to vacuum evacuate the preliminary exhaust chamber or the vacuum chamber (sample chamber). At this time, as described above, prior to executing the instruction to open the vacuum valve, the control unit 30 notifies the feedback gain arithmetic operation unit 36 to switch to the parameter when the valve is opened. The feedback gain arithmetic operation unit 36 that received the notification derives a feedback gain from the evaluation function of the optimum regulator using the control parameters $p_x$ and $p_y$ for exhausting the valve and stores the feedback gain in the feedback gain storage unit 32.

As a result, it is possible to switch to the optimal control for exhausting the vacuum valve. For example, in the present embodiment, in a case where a vibration direction of the vacuum chamber 3 due to valve opening is mainly the X axis, a control parameter is set to $p_x > p_y$. Note that, the parameters may be switched in conjunction with a valve provided between the preliminary exhaust chamber and the sample chamber and between the preliminary exhaust chamber and the atmospheric space and opened during loading and unloading of the sample. It is not necessary to calculate the control parameter on-line, and the feedback gain storage unit may have a feedback gain for each disturbance type. Furthermore, it is possible to easily realize a configuration in which the sequence control unit 30 holds the feedback gain for each disturbance type and transfers the feedback gain to the feedback gain matrix storage unit 35.

Vibration suppression control is performed using parameters (gains) prepared for opening the valve during a period from the valve opening to an influence of vibrations due to the valve opening, and after completion of the above period, switch to steady state parameters. In the flowchart illustrated in FIG. 3, there is a stage movement as another event to switch from the steady state to another state, the stage is disposed in the vacuum chamber, and is driven to irradiate a desired position on the sample with the electron beam, however, vibrations also occur at that time. If such vibrations can be suppressed promptly, the high throughput of the device can be realized.

In the present embodiment, the feedback gain arithmetic operation unit 36 is notified of switching to the stage movement control before execution of the stage movement control by the control unit 30. The gain state at the stage movement is maintained until the predetermined waiting time elapses after the stage is stopped and switched to the gain for the steady state before an image capturing process based on the electron beam scanning. In a case where there is a plurality of measurement points, stage movement, image capturing, stage movement, image capturing, , , will be repeated, so that the gain is switched each time. In a case of X-Y stage, the weights of $p_x$ and $p_y$ may be adjusted according to distances in the X and Y directions respectively since the vibrations in the X direction is greater than the vibrations in the Y direction and vice versa according to the movement direction.

With the above design, control parameters can be switched for each type of disturbance that can occur on the recipe sequence. However, the control parameters of each disturbance largely change depending on a natural frequency of each mechanism and an installation environment of the charged particle radiation device. Therefore, it is desirable to periodically adjust parameters according to environmental changes.

Therefore, in the present embodiment, the sequence control unit 30 and the feedback gain arithmetic operation unit 36 have a mechanism for automatically adjusting the control parameters of $p_x$ and $p_y$. In the device installation environment, the arithmetic operation control unit 31 sweeps the control parameters within a defined range and searches for an adjustment parameter that minimizes an evaluation value J calculated in Equation 14. The evaluation value J uses the norm of the movement amount during T seconds from the start of control.

$$J = \int_0^T \{x(t)^2 + y(t)^2\} dt \qquad \text{[Equation 14]}$$

As a result of the search, the values of $p_x$ and $p_y$ with the smallest evaluation value J are used for vibration suppression control. By this, vibration suppression control suitable for changing ground motion disturbance is realized.

In addition, the parameter search needs to be executed as appropriate in accordance with an aging degradation of the device and changes in the device installation environment. The search does not have to be executed manually. In order to periodically update the optimum parameters, it may be executed periodically on the control sequence. For example, in the sequence control shown in FIG. 3, the control at the time of inspection can always be automatically adjusted so as to optimize parameter set in accordance with a device condition by automatically searching for parameters at the start of the sequence.

Embodiment 2

Next, another charged particle radiation device having a function of adjusting a control characteristic of a vibration suppression mechanism will be described. In the charged particle radiation device, a vibration elimination device is used as described above. As the vibration elimination device, a vibration attenuation member such as an air spring, a coil spring, an anti-vibration rubber or the like is used. Although the vibration elimination device exerts high vibration elimination performance against floor vibrations of a high frequency, when an installed floor surface of the device vibrates at a natural frequency of the vibration elimination device, there is a problem of amplifying the vibrations at the frequency. In that case, a driving mechanism such as a voice coil motor or a pneumatic actuator can be installed in a sample chamber, and it can deal with by actively eliminating vibrations of the sample chamber.

In the following, a charged particle radiation device will be described that calculates a vibration amount allowance value of the sample chamber in advance with respect to an image shake amount and adjusts and controls the control characteristic of the vibration elimination system using a sample chamber vibration amount observed by the device sensor and the calculated vibration amplitude allowance value. In the embodiment described below, there is provided a charged particle radiation device mainly including: a sample chamber; a charged particle optical system mounted in the sample chamber; an image processing device for processing a signal detected by the charged particle optical system; a vibration amount detection unit for measuring a vibration amount of the sample chamber; a driving mechanism for finely vibrating the sample chamber; and a control device for controlling the driving mechanism, in which the control device adjusts a control characteristic of the driving mechanism using image information obtained from the charged particle optical system and vibration information of the sample chamber.

According to the above configuration, the floor vibration frequency contributing to the image shake and the vibration amplitude thereof can be calculated by obtaining the sample chamber vibration allowance value with respect to the image shake amount of an SEM image in advance, and it is possible to configure a vibration elimination system having an optimum vibration elimination characteristic for reducing the image shake amount.

The embodiment described below relates to a charged particle radiation device such as a length measurement SEM and a vibration elimination mechanism applicable thereto. Hereinafter, the embodiment will be described with reference to the drawings.

FIG. 5 is a diagram showing a configuration of a charged particle radiation device according to the present embodiment. In FIG. 5, on a base 507 fixed in the sample chamber 501, a Y table 509 that can freely move in the Y direction (the depth direction of the page) via two Y linear guides 512y and 513y are disposed, and a Y linear motor 514y is also disposed so as to generate a thrust force relatively in the Y direction. On the Y table 509, there is disposed an X table 508 that can freely move in the X direction via two X linear guides 512x, and an X linear motor (not shown) generates a thrust force in the X direction. As a result, the X table 508 can move in the XY direction to the base 507 and the sample chamber 501.

A wafer 502 is placed on the X table 508. In the disposition of the wafer 502 a wafer holding mechanism having a holding force such as a mechanical restraining force or an electrostatic force is used.

On an upper surface of the base 507, a brake mechanism (not shown) for braking the Y table is disposed. It is desirable that the braking mechanism perform a pressing operation using a piezoelectric element or the like so as to release a braking force when the stage moves and generate a braking force when the stage is stopped.

In addition, the X table 508 is provided with a laser interferometer 510x and a mirror 511x for measuring a position of the table in the X direction. The X laser interferometer 510x irradiates the mirror 511x with a laser light and measures a relative displacement amount (hereinafter referred to as X laser value) in the X direction between the sample chamber 501 and the X table 508 by using the reflected light. By feeding back the X laser value to the control device 506, a servo control system for the X direction is configured.

Similarly, in the Y direction, a relative displacement in the Y direction of the X table 508 is detected by using the laser interferometer (not shown) to configure the servo control system. As a result, the X table 508 is positioned at a desired position in the XY direction, and an entire surface of the wafer 502 is inspected and measured.

In order to eliminate vibrations transmitted from the floor to the sample chamber on a lower surface of the sample chamber 501, a total of four vibration elimination mounts 516 are disposed two by two on each XY axes, as a passive vibration elimination device.

A vibration elimination mechanism 515 is disposed as an active vibration elimination on the side surface of the sample chamber 501, and a voice coil motor or the like is provided as an actuator. The vibration elimination mechanism 515 generates a vibration addition force that is in opposite phase to the vibrations of the sample chamber due to the floor vibrations, and eliminates vibrations of the sample chamber caused by the floor. In addition, the vibration elimination mechanism 515 can cancel the reaction force applied to the sample chamber by driving the stage by transmitting the thrust signal when the XY table is in operation as the driving thrust of the actuator.

In the sample chamber 501, a column 503 for holding an electron optical system is disposed. In the column 503, an electron gun 505 for generating a secondary electron image by the electron radiation 504 is provided. The generated secondary electrons are detected by a secondary electron detector 517. Secondary electron signals detected by the secondary electron detector 517 are converted into an SEM image by inputting the signals to an image processing device 518. The obtained SEM image is input to an image shake amount calculation device 519 to calculate an image shake amount. Note that, the image shake amount is preferably obtained by measuring an edge of the pattern from the change in light and shade of the SEM image and performing Fourier transformation on the edge of the pattern. The calculated image shake amount is input to the control device 506 and used for adjusting the control characteristic of the actuator that drives the vibration elimination mechanism.

The control device 506 includes an arithmetic operation processing unit, an amplifier for driving a linear motor 514, an amplifier for driving a reaction force canceling mechanism 515, or the like. The control device 506 constitutes a servo control system for calculating the driving force of the XY table and the reaction force canceling mechanism.

With the above configuration, the wafer 502 can be moved in the XY plane to the sample chamber 501, and image capturing of the sample can be performed by the column 503.

Although the linear guide is used as a guide mechanism in the present embodiment, other guide mechanisms (for example, fluid bearing, magnetic bearing, or the like) also can be used. Although the linear motor is used as the driving mechanism, it is also possible to use an actuator usable in a vacuum such as a ball screw or a piezoelectric actuator. Furthermore, a laser interferometer is used for position detection of the stage, however, other position detection methods such as a linear scale can be used, for example.

FIG. 6 is a schematic diagram of the vibration elimination mechanism. On the X axis of the sample chamber 501, an acceleration sensor 521x for detecting the acceleration of the sample chamber is installed. At least one acceleration sensor 521x may be provided on the upper surface, the side surface, or the lower surface with respect to the X axis of the sample chamber 501.

A voice coil motor stator 523x is disposed on the X-axis side surface of the sample chamber 501. A voice coil motor mover 522x is attached to a base stage 524x via the supporting arm 525x so that the reaction force when driven is released to the floor 526 through the base stage 524x. Two voice coil motors (522, 523) are provided on the side surface of the X axis, and the vibration addition force is generated in the X axis translation direction by uniformly adding vibrations to the left and right sides. In addition, by changing the thrust distribution of the left and right voice coil motors, it is possible to generate the vibration addition force in the rotation axis direction (θ axis) on the XY plane.

The control device 506 feeds back signals observed by the acceleration sensor 521x and a servo control system is configured in the control device 506. In the servo control system of the vibration elimination system, low frequency vibration components that are difficult to eliminate with vibration elimination mount 516 are targeted. For example, assuming that the eigenvalue of the vibration elimination mount is 1 Hz, the 1 Hz vibration component transmitted from the floor increases. Therefore, the frequency bandwidth including the mount eigenvalue of 0.1 Hz to 20 Hz may be set as a target frequency of the active vibration elimination system. As a result, the vibration elimination mechanism 515 can compensate the vibration elimination mount 16 at the frequency difficult to reduce vibrations. A vibration elimination mechanism having the same configuration as the X axis is also provided on the Y axis. Therefore, it is possible to control the sample chamber 501 in the XYθ axis direction.

FIG. 7 is a flowchart for calculating an allowance value of sample chamber vibration with respect to an image shake amount. In the process, an allowance value of the sample chamber vibration amount for the image shake is obtained by capturing the SEM image at the time of adding vibrations to the sample chamber 1 in a state of not performing the vibration elimination control in advance and by calculating the sample chamber vibration amount at the time of the image shake allowance limit.

In S701, a frequency at which vibrations are added to the sample chamber 1 is determined. Generally, since the low frequency is the cause of the image shake due to floor vibration, the vibration addition frequency may be determined in the range of several Hz (fs in the figure) to several tens Hz (fe in the figure) (for example, 0.1 Hz to 20 Hz). At that time, it may be better to increase the vibration addition frequency at intervals of the frequency Δf or to make the vibration addition frequency equal at intervals logarithmically. The measurement may be performed with a finer frequency pitch in the vicinity of frequencies where the amount of vibration is large.

In S702, a vibration addition force for the sample chamber 1 is determined. At the time of adding vibrations, it is preferable to start from a small amplitude in order to avoid excessive vibration of the sample chamber 1.

In S703, the vibrations are added to the sample chamber with the vibration addition frequency and the vibration addition force determined in S701 and S702. As a vibration addition method, it is possible to use a method using a voice coil motor (522, 523) installed in the device, or a method of installing a vibrator under the device base stage 524 and vibrating. Also, when adding the vibrations, it is desirable to add vibrations to each axis separately in order to calculate the vibration amplitude allowance value for each axis of X and Y axes.

In step S704, the sample is observed while adding vibrations to the sample chamber 1, and an SEM image is captured. In order to obtain the same measurement condition for all the frequencies adding vibrations, an image capturing condition such as the magnification at the time of image capturing and the number of frames may be fixed.

In S705, the vibration amount of the captured SEM image is analyzed. As a method of analyzing, it is possible to extract the edge of the pattern and use Fourier transform or the like by image processing the SEM image. Further, the vibration amount yc of the sample chamber is measured by using the acceleration sensor 521 installed in the sample chamber. As a result, the relationship between the image shake amount (yi, not shown) at the frequency that vibrations are added and the vibration amount yc of the sample chamber can be obtained.

Note that, the calculated image shake amount yi may include an effect of laser noise or the like in some cases. In that case, the image shake amount in a state in which no vibration is added to the sample chamber 1 in advance may be saved as reference data and the influence of laser noise or the like may be removed by subtracting from the image shake amount in a state in which vibrations are added.

In S706, it is determined whether or not the calculated image shake amount yi is within the specification value of the charged particle radiation device. If it is within the allowance value, the process returns to S702 and sets the value of the vibration addition force larger than the previous vibration addition force.

In S707, by repeating the processes up to S706, the sample chamber vibration amount in a case where the image shake allowance value defined in the device is calculated.

In S708, it is determined whether or not the vibration amount allowance value has been calculated for all the frequencies. When not completed, the process returns to S701, the frequency is changed, and measurement is performed again.

FIG. 8 is a schematic diagram representing the relationship between the vibration frequency and the sample chamber vibration allowance value. The allowance value curve 800 is obtained by plotting the allowance value obtained by the sample chamber allowance value calculation process in FIG. 7. At that time, by performing data interpolation such as spline interpolation and Lagrangian interpolation for the measurement point, it is also possible to calculate the allowance value of the frequency which is not measured in FIG. 3. A constant value α when the sum of the image shake vibration amounts yi at each frequency becomes the specification value Yspec of the image shake amount is obtained.

$$Y_{spec} = \alpha \sum_{f=fs}^{fe} yi(f)$$ [Equation 15]

By multiplying the allowance value curve 800 by α in [Equation 15], it is possible to obtain the sample chamber vibration amount yc when the sum of the image shake amount yi at each frequency becomes the image shake allowance value of the device. As a result, if the control characteristic of the vibration suppression system is adjusted so as to be equal to or less than the allowance value curve 800, it is possible to satisfy the image shake specification.

The allowance value curve 800 in FIG. 8 is stored in the control device 6. At that time, by polynomial approximation of the allowance value curve 800, it is also possible to reduce the memory amount to be saved in the control device 506. Note that, the image shake specification value Yspec may be set to a small value in consideration of device differences, characteristic changes, or the like.

Further, by constantly monitoring the sample chamber vibration amount and comparing with the allowance value curve 800 in FIG. 8, it can be used for abnormality diagnosis of the device by determining whether or not the image shake amount is within the allowance range at the time of device operation. Note that, in a case where the determination result exceeds the allowance value curve 800, it may be displayed on the display to notify an operator of the abnormality of the device.

FIG. 9 is a flowchart used for initial adjustment of the control characteristic of the vibration elimination system. The process is performed when installing the device on a floor surface of a customer and initializing the device. In S901, the charged particle radiation device is powered on to initialize each sensor, a stage device, and an electron optical system, and set them in a usable state. In S902, the vibration amount of the sample chamber is measured by the acceleration sensor 521 installed in the sample chamber 501.

In S903, the vibration amount for each frequency is calculated with respect to the measured vibration waveform using the Fourier transform or the like. In S904, the allowance value curve in FIG. 8 saved in the control device 506 is compared with the calculated sample chamber vibration amount. If there is a frequency bandwidth exceeding the allowance value, a frequency which is the peak of the vibration amount is saved. In S905, parameters of a controller mounted in the control device 506 are determined using the saved frequencies, and the control characteristic is adjusted. In S906, the wafer 502 is conveyed to the sample stage, and measurement of the sample is started.

FIG. 10 is an example showing a comparison between the sample chamber vibration amount and the allowance value. A solid line in FIG. 10 is the allowance value in FIG. 8, and a broken line is the sample chamber vibration amount calculated in S903 in FIG. 9. In this example, it is understood that the vibration amount yc exceeding the allowance value yo is generated in the vicinity of the frequency having the frequency fc as a peak. In the low frequency range targeted by the vibration elimination mechanism, in many cases, it has one peak frequency fc depending on the floor surface on which the device is installed. In this case, suppose that the frequency for which control characteristic adjustment is required is $f_c$.

FIG. 11 is a flowchart of vibration elimination system adjustment at the time of sample observation. In S1101, the coordinate of the sample to be measured is determined, and a visual field target position of the SEM image centered on the measurement point is determined. In S1102, the sample stage is moved to the visual field target position. In S1103, focusing, positioning, or the like at the time of image capturing the sample are performed to measure the sample. At that time, a sample chamber vibration is measured using the acceleration sensor 521.

In S1104, compare the sample chamber vibration with the sample chamber vibration allowance value in FIG. 8, and if it is within the allowance value, the process proceeds to S1107. When the allowance value is exceeded, the process proceeds to S1105. At this time, the fact that the image shake amount exceeds the allowance value may be displayed on the display and the operator may be notified. In S1105, the control characteristic of the vibration elimination system is re-adjusted so as to be within the allowance value. In S1106, the re-adjusted vibration elimination system is applied and the sample is re-measured. In step S1107, it is determined whether or not the measurement of the entire coordinates is completed, and when completed, move to another sample measurement. When not completed, the process returns to S1101 to determine the next measurement coordinate.

By constantly monitoring whether the sample chamber vibration amount is within the allowance value using the process, it is possible to deal with when the frequency or the amplitude of the floor vibration changes.

FIG. 12 is a block diagram of a servo control system mounted in the control device 506. The vibrations of the sample chamber 501 are monitored by the acceleration sensor 521 and negatively fed back to a feedback controller 581, and a thrust command provided to the voice coil motor mover 522 is calculated. In general, an integrator or a low pass filter or the like is used as the feedback controller 581.

The thrust distributor 582 distributes the thrust commands of the voice coil motor movers 522 disposed two by two on each XY axes, in order to suppress the rotational motion in the XY plane due to the change in the center of gravity of the sample chamber by the sample stage position.

The thrust commands of the voice coil motor are input to the voice coil motor amplifier 583, and generates a driving current for driving the motor. The generated motor driving current is supplied to the voice coil motor movers 522, thereby generating the vibration addition force to the sample chamber 1.

The vibration elimination characteristic adjuster 584 uses the vibration amount of the sample chamber and the allowance value thereof for adjusting the control characteristic from the comparison result. An example of an adjustment method of the feedback controller 581 and the vibration elimination characteristic adjuster 584 will be described below.

[Procedure 1] Derivation of Sample Chamber Model $$P(s) = \frac{K_0}{s^2 + 2\zeta_0\omega_0 s + \omega_0^2}$$ [Equation 16]

First, a sample chamber model is derived. [Equation 16] is a transfer function of the sample chamber model. $\zeta_0$ is an attenuation coefficient, $\omega_0 (=2\pi f_0)$ is an angular frequency, $K_0$ is a constant value determined by the thrust constant of the voice coil motor (522, 523) and a mass of the entire sample chamber 501. Each coefficient $\zeta_0$, $\omega_0$ and $K_0$ in the

[Equation 16] can be calculated from the measurement result of the frequency characteristic by a sinusoidal sweep method.

[Procedure 2] Design of Vibration Elimination Characteristic Adjuster 84

$$C_f(s) = \frac{\omega_0^2}{\omega_c^2} \frac{s^2 + 2\varsigma_0 \omega_0 s + \omega_0^2}{s^2 + 2\varsigma_0 \omega_c s + \omega_c^2} \quad \text{[Equation 17]}$$

In this example, in order to adjust the control characteristic according to the vibration frequency of the sample chamber transmitted from the floor, the vibration elimination characteristic adjuster 584 is used. The transfer function of the vibration elimination characteristic adjuster 584 is shown in [Equation 17]. $\omega_c(=2\pi f_c)$ is the angular frequency determined by $f_c$ calculated from the process S503 and S504 in FIG. 5.

The vibration elimination characteristic adjuster 584 can uniquely obtain the coefficient according to the vibration frequency fc and arbitrarily adjust the apparent eigenvalue of the control target. As a result, it is capable of performing the frequency bandwidth vibration elimination centered on the frequency fc.

[Procedure 3] Design of Feedback Controller 81

$$C_i(s) = K \frac{\omega_c}{s + \omega_c} \quad \text{[Equation 18]}$$

A first order low pass filter is used as a feedback controller. $\omega_c$ is a corner frequency of a filter, and K is an adjustment gain. As a determination method of K and $\omega_c$, it is desirable to automatically adjust the coefficient parameters using an optimization algorithm such as a genetic algorithm or a particle group optimization. In a case where there is a second frequency peak close to the frequency bandwidth (fs to fe) targeted by the vibration elimination mechanism, the control gain K may be adjusted so that the sample chamber vibration amount yc of the frequency satisfies a threshold curve.

Note that, in the present example, the formulas shown in [Equation 17] and [Equation 18] are used as the controller of the vibration elimination system, however, the transfer function of the controller is not limited to [Equation 17] and [Equation 18], and it can also be configured with other controllers.

Further, the above described servo control system can be constructed not only in the XY axis translation direction of the sample chamber but also on the rotation axis on the XY plane. According to the charged particle radiation device configured as described above, the floor vibration frequency contributing to the image shake can be calculated by obtaining the sample chamber vibration allowance value with respect to the image shake amount of an SEM image, and it is possible to configure a vibration elimination system having an optimum vibration elimination characteristic for reducing the image shake amount.

REFERENCE SIGNS LIST

1 floor
2 base stage for installing a device
3 vacuum chamber
4, 5, 6, 7 supporting pole
8, 9, 10, 11 vibration elimination mount
12, 13, 14, 15 stator
16 electron beam source
17 XY stage
18 vacuum valve
19, 20 acceleration sensor
21, 22, 23, 24 mover
25 sample
26 supporting pole in a vacuum chamber
27 laser length measurement meter
28 mirror
29 position signal
30 sequence control unit
31 arithmetic operation control unit
32 charged particle radiation
33 multiplier
34 thrust distributor
35 amplifier
101 input matrix arithmetic operator by a linear actuator
102 input matrix arithmetic operator by a driving reaction force of a stage
103 addition point
104 addition point
105 integrator
106 system transition matrix
107 output control matrix arithmetic operator

The invention claimed is:

1. A charged particle radiation device comprising:
   a sample chamber;
   a charged particle optical system mounted in the sample chamber;
   an image processing device for processing a signal detected by the charged particle optical system;
   a sensor for measuring a vibration amount of the sample chamber;
   a driving mechanism for finely vibrating the sample chamber; and
   a control device for controlling the driving mechanism,
   wherein the control device adjusts a control characteristic of the driving mechanism using image information obtained from the charged particle optical system and vibration information of the sample chamber,
   wherein the control device extracts an image shake amount from the image and calculates a vibration frequency of the sample chamber using the image shake amount, and
   wherein the control device calculates an allowance value of a sample chamber vibration amount from the image shake amount of the image.

2. The charged particle radiation device according to claim 1,
   wherein the control device determines an abnormal image shake amount of the device by comparing the image shake amount of the image with the allowance value of the sample chamber vibration amount.

3. The charged particle radiation device according to claim 2,
   wherein the control device performs an abnormality diagnosis of the device using the image shake amount of the device and the sample chamber vibration amount, and indicates the result to an operator.

4. The charged particle radiation device according to claim 1,
   wherein an active vibration elimination mechanism adjusts the control characteristic so as to supplement a frequency bandwidth which is difficult to eliminate a vibration with a passive vibration elimination device.

\* \* \* \* \*